(12) United States Patent
Butler et al.

(10) Patent No.: US 8,994,919 B2
(45) Date of Patent: Mar. 31, 2015

(54) LITHOGRAPHIC APPARATUS AND DEVICE MANUFACTURING METHOD

(75) Inventors: Hans Butler, Best (NL); Marc Wilhelmus Maria Van Der Wijst, Veldhoven (NL); Cornelius Adrianus Lambertus De Hoon, Best (NL)

(73) Assignee: ASML Netherlands B.V., Veldhoven (NL)

( * ) Notice: Subject to any disclaimer, the term of this patent is extended or adjusted under 35 U.S.C. 154(b) by 1872 days.

(21) Appl. No.: 12/244,326

(22) Filed: Oct. 2, 2008

(65) Prior Publication Data

US 2009/0103066 A1 Apr. 23, 2009

Related U.S. Application Data

(60) Provisional application No. 60/960,514, filed on Oct. 2, 2007.

(51) Int. Cl.
*G03B 27/42* (2006.01)
*G03F 7/20* (2006.01)
*G05D 19/02* (2006.01)

(52) U.S. Cl.
CPC ............ *G03F 7/70775* (2013.01); *G03F 7/709* (2013.01); *G05D 19/02* (2013.01)
USPC .......................................................... 355/53

(58) Field of Classification Search
USPC .......... 355/53, 72–76; 318/135; 356/399–401
See application file for complete search history.

(56) References Cited

U.S. PATENT DOCUMENTS

| 5,371,670 A | 12/1994 | Lurie |
| 6,448,723 B1* | 9/2002 | Wakui ............................ 318/135 |
| 7,110,083 B2* | 9/2006 | Loopstra et al. ................ 355/53 |
| 7,726,452 B2* | 6/2010 | Kraner ........................... 188/378 |
| 2002/0149754 A1 | 10/2002 | Auer et al. |
| 2003/0169412 A1* | 9/2003 | Hazelton ......................... 355/72 |
| 2007/0097340 A1* | 5/2007 | Yuan et al. ....................... 355/53 |

FOREIGN PATENT DOCUMENTS

| EP | 0 309 211 A2 | 3/1989 |
| JP | 01-138663 A | 5/1989 |
| JP | 03-102683 A | 4/1991 |
| JP | 03-123910 A | 5/1991 |
| JP | 06-061791 A | 3/1994 |
| JP | 2001-068396 A | 3/2001 |

(Continued)

OTHER PUBLICATIONS

Weisstein, Eric W. "Newton's Iteration." From MathWorld—A Wolfram Web Resource. http://mathworld.wolfram.com/NewtonsIteration.html, printed Jan. 15, 2009, 3 pgs.

(Continued)

*Primary Examiner* — Hung Henry Nguyen
(74) *Attorney, Agent, or Firm* — Sterne, Kessler, Goldstein & Fox P.L.L.C.

(57) ABSTRACT

A control system for controlling a position or position related quantity of an object is provided. A measurement system is configured to measure a position or position related quantity of the object. A controller is configured to provide a control signal on the basis of the measured position or position related quantity. A actuator actuates the object on the basis of the control signal. A filter unit, which may be a partial order filter unit, filters the measured position or position related quantity.

18 Claims, 7 Drawing Sheets

(56) References Cited

FOREIGN PATENT DOCUMENTS

| JP | 2001-221279 A | 8/2001 |
| JP | 2004-279935 A | 10/2004 |
| WO | WO 02/097546 A1 | 12/2002 |
| WO | WO 2005/121901 A1 | 12/2005 |

OTHER PUBLICATIONS

European Serach Report directed to related European Application No. 08 165 684.5, mailed Jan. 11, 2011 from the European Patent Office, Munich, Germany; 5 pages.

English translation of Japansese Notice of Reasons for Rejection directed toward related Japanese Patent Application No. 2008-256544, mailed Mar. 7, 2011 from the Japanese Patent Office; 3 pages.

Chen, Y., et al., "Fractional Order Disturbance Observer for Robust Vibration Suppression," *Nonlinear Dynamics 38*:355-367, Kluwer Academic Publishers, the Netherlands (2004).

Hartley, T., et al., "A Frequency-Domain Approach to Optimal Fractional-Order Damping," *Nonlinear Dynamics 38*: 69-84, Kluwer Academic Publishers, the Netherlands (2004).

Orsoni, B., et al., "Fractional Motion Control: Application to an XY Cutting Table," *Nonlinear Dynamics 29*: 297-314, Kluwer Academic Publishers, the Netherlands (2002).

Sabatier, J., et al., "Active Wave Control for Flexible Structures Using Fractional Calculus," *Advances in Fractional Calculus*, pp. 435-448, Springer (2007).

\* cited by examiner

LITHOGRAPHIC APPARATUS AND DEVICE MANUFACTURING METHOD

CROSS-REFERENCE TO RELATED APPLICATION

This application claims the benefit of the filing date of U.S. provisional application 60/960,514, filed on Oct. 2, 2007. The subject matter of the provisional application is incorporated herein by reference as if fully set forth herein.

BACKGROUND OF THE INVENTION

1. Field of the Invention

The present invention relates to a control system to control a position or position related quantity such as velocity or acceleration of an object, a lithographic apparatus including a control system and a method for increasing the bandwidth of a position control system.

2. Background Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In known lithographic apparatus, control systems are used to control the position or position related quantities such as velocity or acceleration of an object. Such a control system may be used to control the position of a movable object with high accuracy, for instance the servo control system of a substrate support or a patterning device support. Similarly, a control system may be used to control the velocity or the acceleration of the object. Because velocity, acceleration and position of an object are closely related, velocity being the time integral of acceleration and position being the time integral of velocity, all three can be regarded as position related quantities of the object. For that reason, the term 'position control' as used herein is intended to cover cases where velocity or acceleration or other position related quantities are the controlled variables.

In other applications, a control system may be used to stabilize the position of a substantially stationary object. Such control system is often referred to as an active damping system. In an active damping system, usually the velocity is the actual controlled variable.

An example of such substantially stationary object is a projection system. Such a projection system includes a number of lens elements and/or mirrors and is held, during projection, in the optical path between a patterning device and substrate. The patterning device and substrate are positioned with respect to the projection system to obtain an optimal imaging quality. However due to vibrations and other movements in the lithographic apparatus, movements of the projection system may occur. In order to suppress these movements it has been proposed to provide an active damping system to minimize movements, velocities, and/or accelerations of the projection system.

A known embodiment of such control system includes an acceleration sensor to measure accelerations of the object, a controller to provide a control signal on the basis of the measured acceleration and an actuator to provide a reaction force to counteract the acceleration and therewith the movement of the object. The actuator is connected to the object and to a reaction mass. In a known embodiment, the mass is a free mass which means that it is only connected to the actuator. As a result, the reaction force is not exerted on for instance a frame. Alternatively, the reaction force could be exerted on a reaction frame or the like.

A drawback of the known embodiment is that the control system may easily become unstable as for higher frequencies the gain of the transfer function of the system may increase while the phase crosses −180 degrees. The increasing gain is for instance a result of lens elements which are mounted with limited stiffness in the projection system, and become decoupled from the housing for frequencies above its resonance frequency. Applying the same force at a higher frequency therefore leads to a higher acceleration, because less mass is actuated when lens elements are decoupled. Therefore, the gain may increase for higher frequencies. The combination of high or even increasing gains for high frequencies increases the risk on an unstable system.

In many control system a first or higher order low-pass filter is applied to dampen the high gains for higher frequencies to avoid instability of the system. However, for the above-described known active damping system the application of such a first of higher order low-pass filter may not be possible since the damping of the gains also implies a phase lag, therewith generally decreasing the frequency at which −180 degrees is crossed and increasing the chance on instability. As a result, it may be difficult or even impossible to position the cut-off frequency of the first or higher order filter such that a stable system is obtained.

Generally, it is not desired to increase the bandwidth of a position control system, the bandwidth being defined as the first frequency where the gain of the open loop transfer function drops below one (0 dB). At the same time it is desired to have a stable system.

BRIEF SUMMARY OF THE INVENTION

It is desirable to provide a stable control system to control a position or position-related quantity such as velocity or acceleration of an object, in particular a stable active damping system. Furthermore, it is desirable to provide a stable system preferably having an optimal bandwidth.

According to an aspect of the invention, there is provided a control system for controlling a position or position related quantity of an object. A measurement system is configured to measure a position or position related quantity of the object. A controller provides a control signal on the basis of the measured position or position related quantity. An actuator actuates the object on the basis of the control signal. The control system further includes at least one filter unit configured to filter the measured position or position related quantity. This filter unit may be a partial order filter unit.

According to an aspect of the invention, there is provided a lithographic apparatus including an illumination system configured to condition a radiation beam; a patterning device capable of imparting the radiation beam with a pattern in its cross-section to form a patterned radiation beam; a substrate table constructed to hold a substrate; and a projection system configured to project the patterned radiation beam onto a target portion of the substrate. The lithographic apparatus includes a control system to control a position or position related quantity of an object of the lithographic apparatus. The control system includes a partial order filter unit.

According to an aspect of the invention, there is provided a method to increase the bandwidth of a control system and a method to obtain a stable control system. These methods employ a filter unit which may be a partial order filter unit.

According to an aspect of the invention, there is provided a device manufacturing method including patterning a beam of radiation to form a patterned beam of radiation; projecting the patterned beam of radiation onto a target portion of a substrate with a projection system; and controlling a position or position related quantity of the projection system. The controlling comprises measuring the position or position related quantity of the projection system; providing a control signal based on the measured position or position related quantity; exerting a force on the projection system based on the control signal, and filtering a signal associated with the measured position or position related quantity. The filter unit is a partial order filter unit.

According to another aspect of the invention, there is provided a control system for controlling a position or position related quantity of an object, including a measurement system configured to measure a position or position related quantity of the object; a controller configured to provide a control signal based on the measured position or position related quantity; an actuator configured to actuate the object based on the control signal, and a filter unit configured to filter a signal associated with the measured position or position related quantity, wherein the filter unit is a partial order filter unit.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
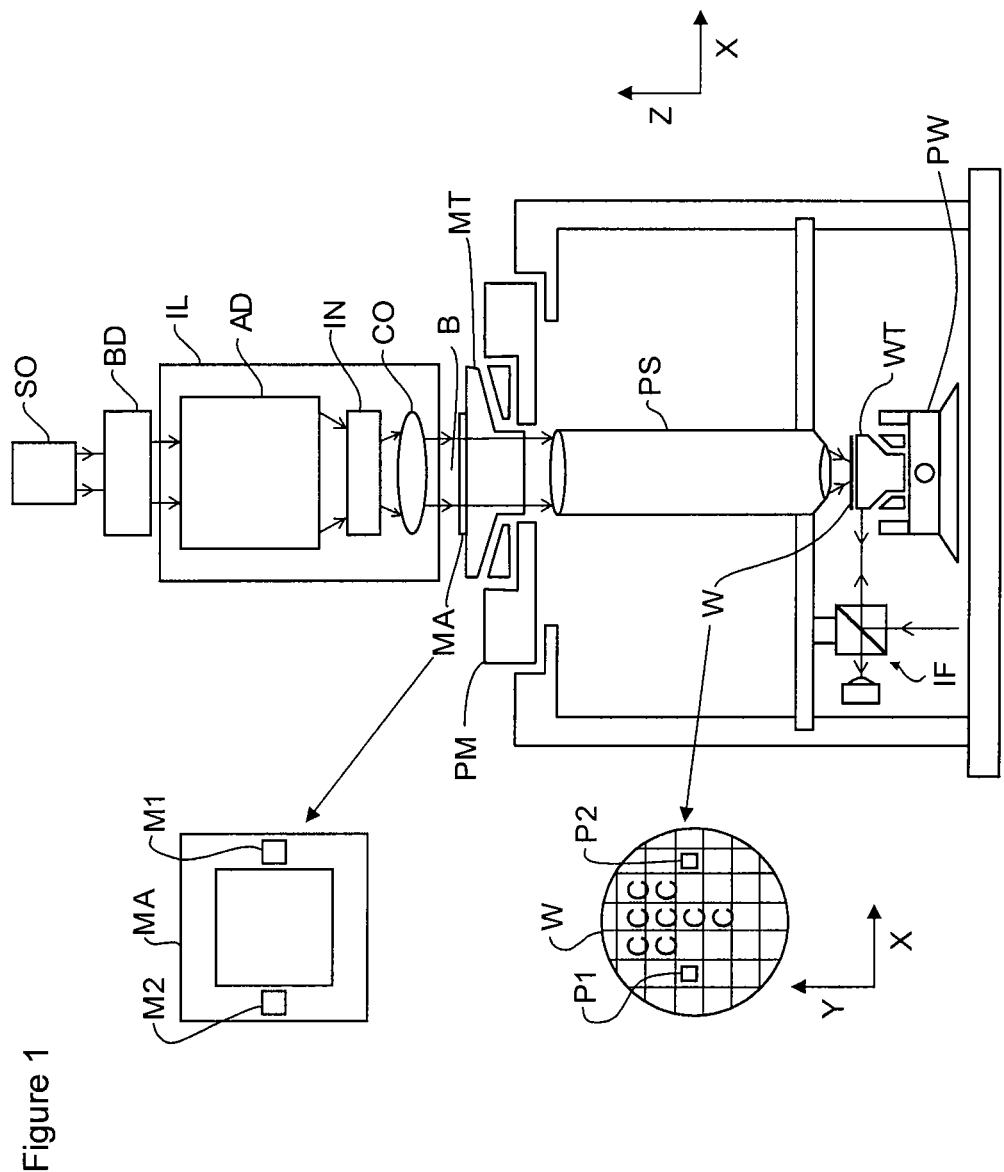
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or pattern support or support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
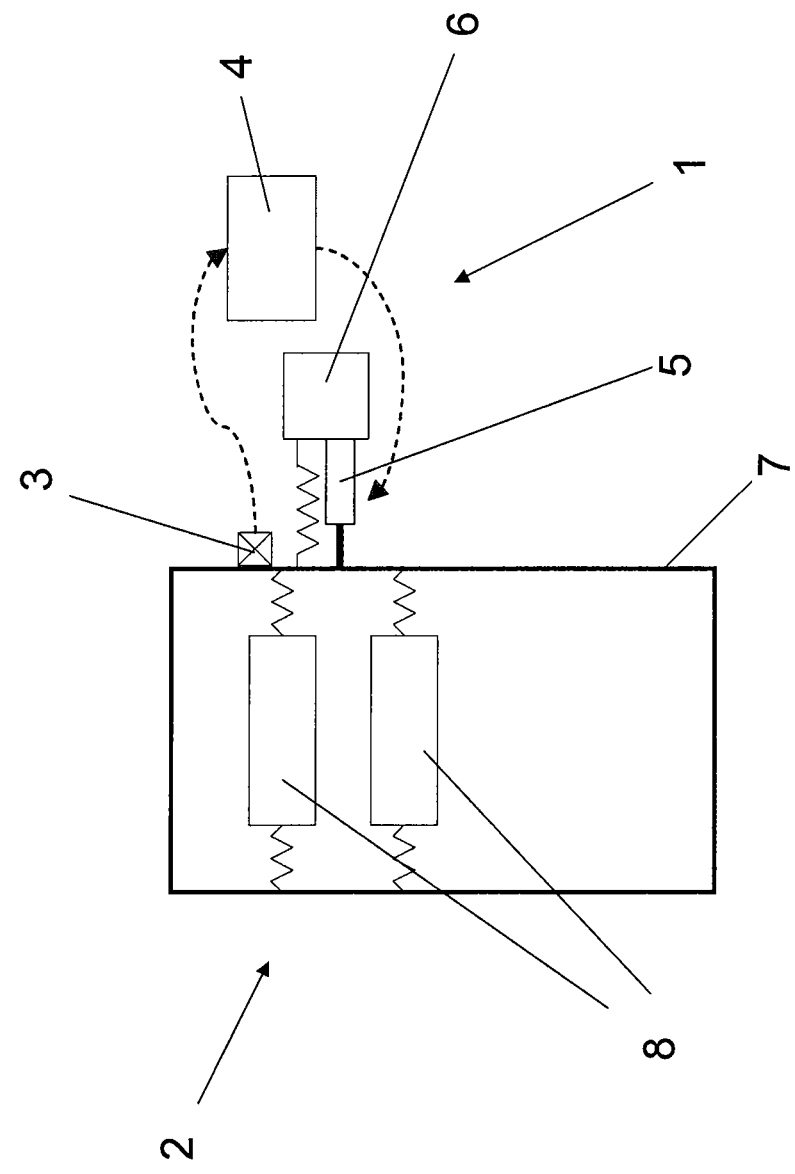
FIG. 2 depicts a projection system and an active damping system according to an embodiment of the invention.

FIG. 2 shows an active damping system 1 configured to control the velocity of a projection system 2. The damping system 1 is provided to minimize the velocity of the projection system 2, and thereby hold projection system 2 in a substantially stationary position. External influences, such as air flows and vibrations, for instance caused by movements of the patterning device support or substrate support, may excite the projection system 2. However, it is desirable that the projection system 2 be held in a substantially stationary position, since movements of the projection system 2 may cause imaging errors, such as focus and/or misalignment errors. To minimize movements of the projection system 2 the active damping system 1 is provided.

The active damping system 1 includes an acceleration sensor 3, a controller unit 4 and an actuator 5.

The acceleration sensor 3 is configured to measure accelerations of the projection system 2 in at least one direction. The controller unit 4 is configured to provide a control signal on the basis of the measured acceleration. The control signal is fed to an actuator 4 which exerts a force on the projection system 2 in a direction opposite to the external disturbance force to damp out any movements that would be otherwise caused by the disturbance force.

The active damping system 1 as shown in FIG. 2 provides damping in a single direction. When desired it is possible to provide a damping device configured to damp movements in two or more directions. It is also possible to provide two or more damping devices to damp out movements in two or more directions.

To exert damping forces on the projection system, the actuator is connected to a counter mass 6, which is only mechanically connected to the actuator. As a result, the actuator can only exert temporary forces and no permanent forces. However, permanent forces are normally not desired when the position control system is only used for damping of movements of the projection system 2. Alternatively, the reaction forces may be transferred to other parts of the lithographic apparatus, for instance a frame, which would allow exerting permanent forces.

In the interior of a housing 7 of the projection system 2 a number of lens elements 8 are mounted. These lens elements 8 are connected by structures in such a way as to provide limited stiffness to the housing 7. This limited stiffness acts as a spring. For increasing frequencies, the lens elements may become decoupled from the housing 7, in particular above the resonance frequency with which the element is mounted to housing 7. As a consequence, the relation between force and resulting acceleration has a relatively increasing gain, i.e. the acceleration becomes higher when the same force, but at higher frequencies is applied.

Figure 3:
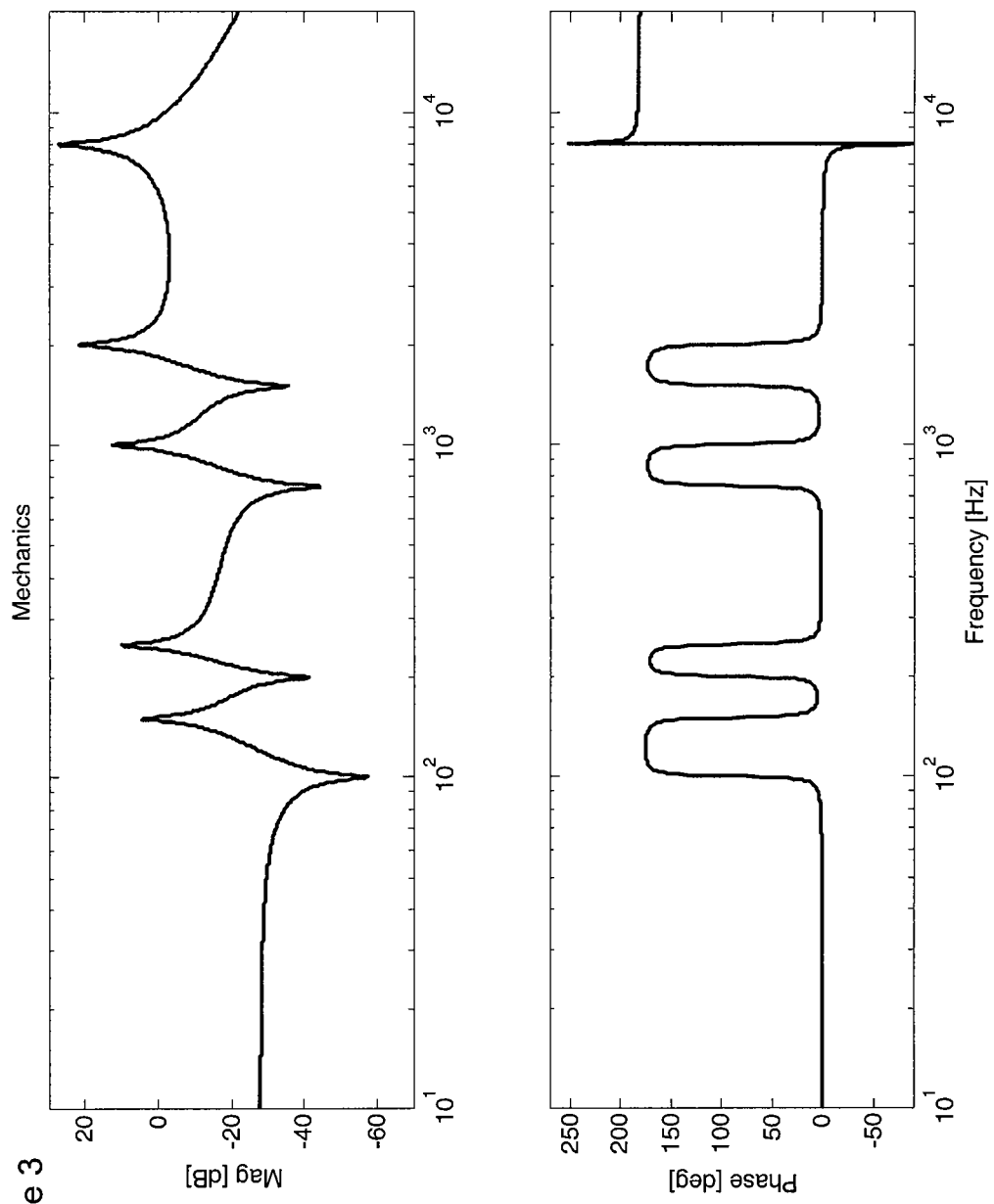
FIG. 3 depicts a Bode plot of the transfer function between actuator force and acceleration of the projection system of FIG. 2.

FIG. 3 shows a typical schematic Bode plot of the transfer between force and acceleration of a damping system according to the invention. The transfer function from force to acceleration typically includes a series of anti-resonance/resonance combinations, with a phase switching between 0 and +180 degrees, as can be seen in FIG. 3. Furthermore, the Bode plot shows an increasing gain for higher frequencies as mass of the lens elements 8 decouples from the system.

To control the movements of this system, a controller unit 4 is provided having an integrator behavior (K/s). In alternative embodiments, other suitable types of controllers may also be applied.

Figure 4:
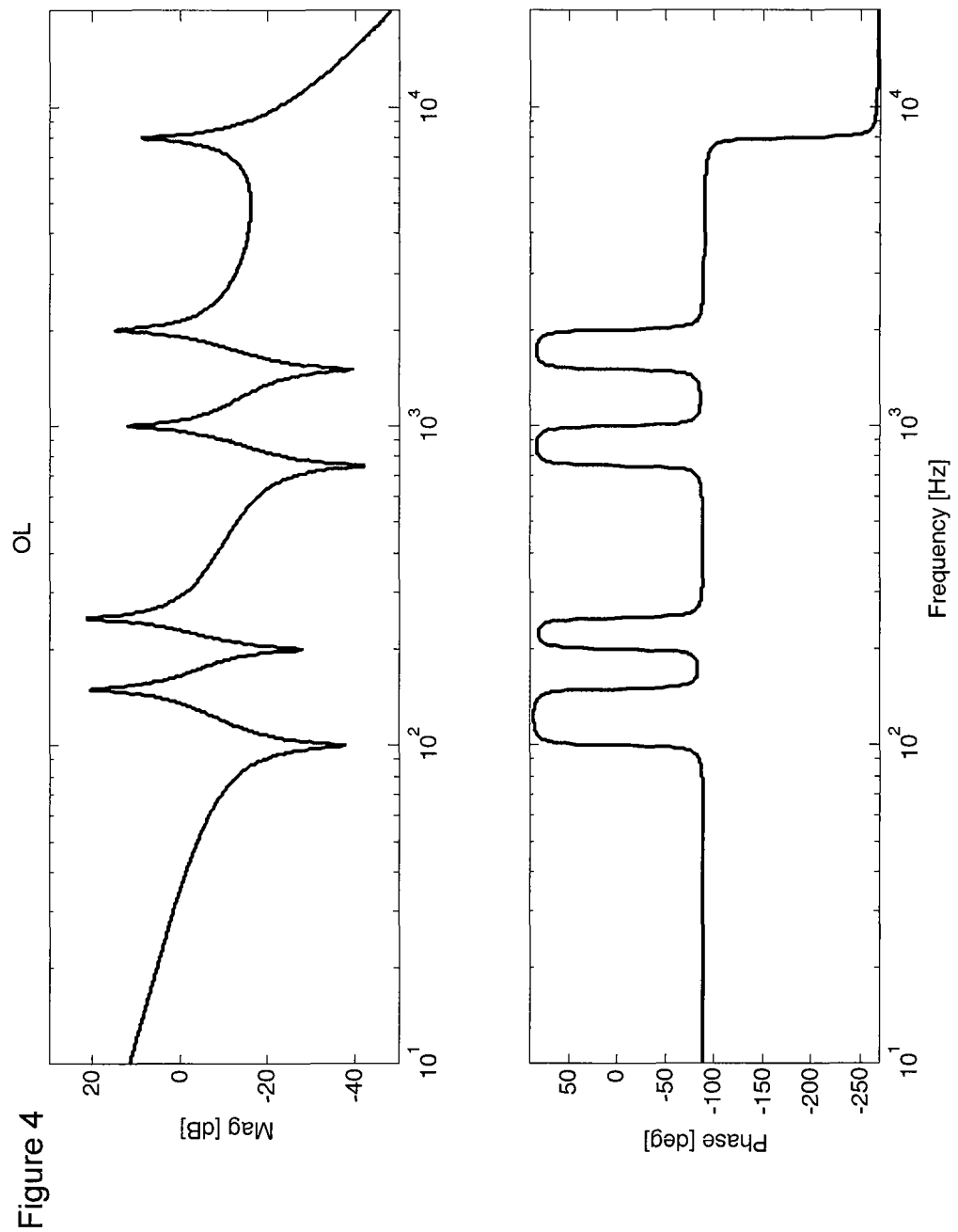
FIG. 4 depicts a Bode plot of the open loop of the prior art active damping system and projection system of FIG. 2.

A schematic open loop Bode plot of this control system is shown in FIG. 4. It can be seen that the system may become unstable. Generally, the amplitude becomes linearly smaller for higher frequencies, while the phase shifts between −90 and +90 degrees. However, at some point the phase will cross −180 degrees, for instance because of an internal resonance, in the present case at 8 kHz. Since the amplitude of the transfer function remains high for higher frequencies, as the mass of the lens elements 8 will decouple from the housing 7, instability may occur as the phase crosses the −180 degrees while the amplitude is larger than 0 dB.

However, as there are many peaks above the 0 dB, it may not be possible to introduce a first order low-pass filter, as such filter will introduce 90 degrees extra phase lag at higher frequencies, while the gain for instance at the cross-over frequency will still be too high. As a result, the resulting system may still be unstable. Generally, it may be very difficult or even impossible for the above described active damping system to position a cut-off frequency of a first order low-pass filter without obtaining an unstable system.

According to an embodiment of the present invention, a partial order filter is applied so that, at a desired frequency, the gain of the system may be decreased without obtaining a too large phase shift and thereby causing the system to become unstable.

For example, a half-order filter may provide a phase shift of 0 to −45 degrees and a gain slope of −10 dB per decade. Such a partial order filter may provide a solution when some gain attenuation is desired. The use of a first order filter having a 90 degrees phase shift would not make sense because its use would result in an unstable system.

A practical application of a half order filter unit will now be described. A first-order low-pass filter can be described as:

$$H(s) = \frac{\omega_0}{s + \omega_0},$$

A half-order low-pass filter then has the transfer function:

$$H(s) = \frac{\sqrt{\omega_0}}{\sqrt{s + \omega_0}}$$

However, every known implementation only is capable of using polynomials in s with integer coefficients.

It is desired to approximate H(s) by a filter with only integer powers of s, because this is desired for actual implementation of the filter. To do this, $\sqrt{s}$ is approximated by a transfer function in s having integer powers of s only. A possible method is the "Newton's Iteration", that is described in: "Weisstein, Eric W. "Newton's Iteration" From MathWorld—A Wolfram Web Resource. http://mathworld.wolfram.com/NewtonsIteration.html".

Here, it was observed that if
$x=\sqrt{s}$, then $x^2=s$ and hence $$x = \frac{s}{x}.$$

Now, x is determined in an iterative process, by taking the new x as the average of x and $$\frac{s}{x}:$$

$$x_{k+1} = \frac{1}{2}\left(x_k + \frac{s}{x_k}\right)$$

For example, if a start value $x_0=1$ is selected, then $$x_1 = \frac{1}{2}(s+1),$$

which is a first approximation of $\sqrt{s}$.
Next approximations would be, $$x_2 = \frac{s^2 + 6s + 1}{4(s+1)}, \quad x_3 = \frac{s^4 + 28s^3 + 70s^2 + 28s + 1}{8(s+1)(s^2 + 6s + 1)},$$

etc. Note that if $$x_k = \frac{p(s)}{q(s)},$$

then $$x_{k+1} = \frac{p^2(s) + s \cdot q^2(s)}{2p(s)q(s)},$$

allowing to calculate approximations of $\sqrt{s}$ with increasing accuracy. Hence, a transfer function containing numerator and denominator polynomials in s arises that includes a number of iterations to obtain an approximation of $\sqrt{s}$.

When inspecting the transfer function that results from the above procedure, and using it as a half-order integrator $1/\sqrt{s}$, it can be observed that indeed a −½ slope occurs, with a phase of −45 degrees. The approximation is correct for a range centered around 1 rad/s (0.16 Hz), e.g. from 0.03 to 30 rad/s (0.005 to 5 Hz).

However, in the application as active damping system for a projection system, a higher frequency range is of interest (e.g. 10 to 10000 rad/s). In this case a better approximation may be obtained by multiplying all poles and zeros in the approximating transfer function by a large number, for example by 3000, which effectively shifts the center frequency around which acceptable behavior occurs from 1 rad/s to 3000 rad/s (or from 0.16 Hz to 500 Hz). Note that the resulting filter still approximates $\sqrt{s}$. Alternatively, a start value other that 1 in the iteration process could be chosen. It was observed that the resulting filter will show acceptable behavior around the frequency equal to the iteration start value.

Figure 5:
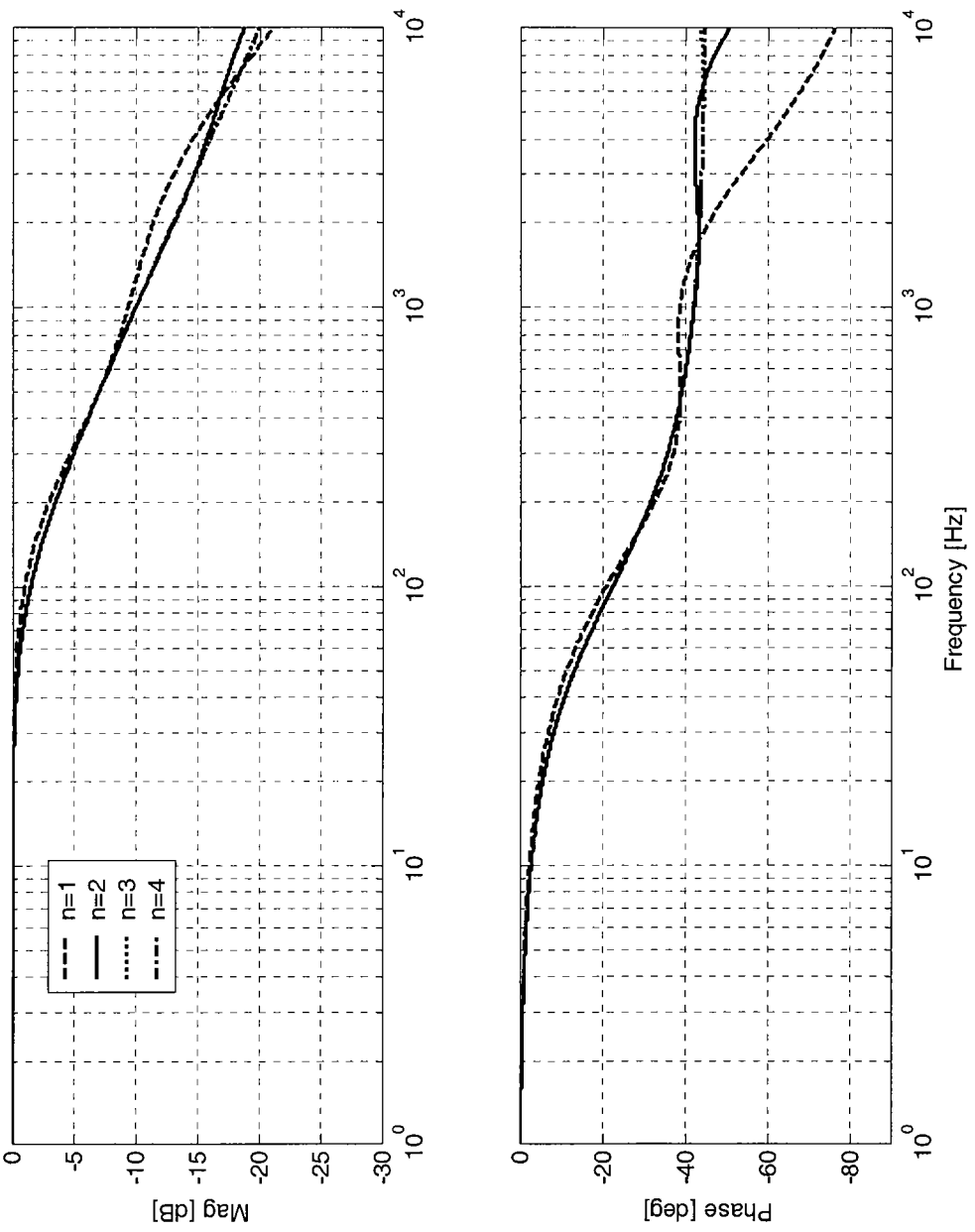
FIG. 5 depicts a Bode plot of half order filter approximated by rational transfer functions of different orders.

Above, an approximation of a half order integrator was shown. To create a half-order low-pass filter, $\sqrt{s}$ is replaced by $\sqrt{s+\omega_0}$, or in other words: all poles and zeros of the approximation of $\sqrt{s}$ are shifted over a distance $-\omega_0$ in the s-plane. The resulting Bode plot for four gradations of the approximation (leading to filters of the order 2, 4, 8 and 16, respectively) are shown in FIG. 5. It is shown that even a low-order approximation ($4^{th}$ order filter, n=2) is relatively accurate and can be used as a partial order filter.

In an alternative embodiment filter units of another partial order may be applied. For instance, a higher roll-off can be obtained by using, e.g., a ⅔-order filter. This would give an average phase shift of −60 degrees, which would still be feasible, since there is still 30 degrees stability margin left when compared to a first order filter unit. Following the lines for the half-order integrator, if $x=s^{2/3}$, then $x^3=s^2$ and hence $$x = \frac{s^2}{x^2}.$$

Again, x is determined in an iterative process, by taking the new x as the average of x and $$\frac{s^2}{x^2}:$$

$$x_{k+1} = \frac{1}{2}\left(x_k + \frac{s^2}{x_k^2}\right)$$

For example, if a start value $x_0=1$ is selected, then $$x_1 = \frac{1}{2}(s^2 + 1),$$

which is a first approximation of $s^{2/3}$. If $$x_k = \frac{p(s)}{q(s)},$$

then $$x_{k+1} = \frac{p^3(s) + s^2 \cdot q^3(s)}{2p^2(s)q(s)}.$$

Hence, a transfer function containing numerator and denominator polynomials in s arises that includes a number of iterations to obtain an approximation of $s^{2/3}$. Filter orders are now 3, 9 and 27, respectively. Because of the above iteration formula's, orders tend to get higher rapidly in this case. It will be appreciated that other order partial filters may also be applied.

Figure 6:
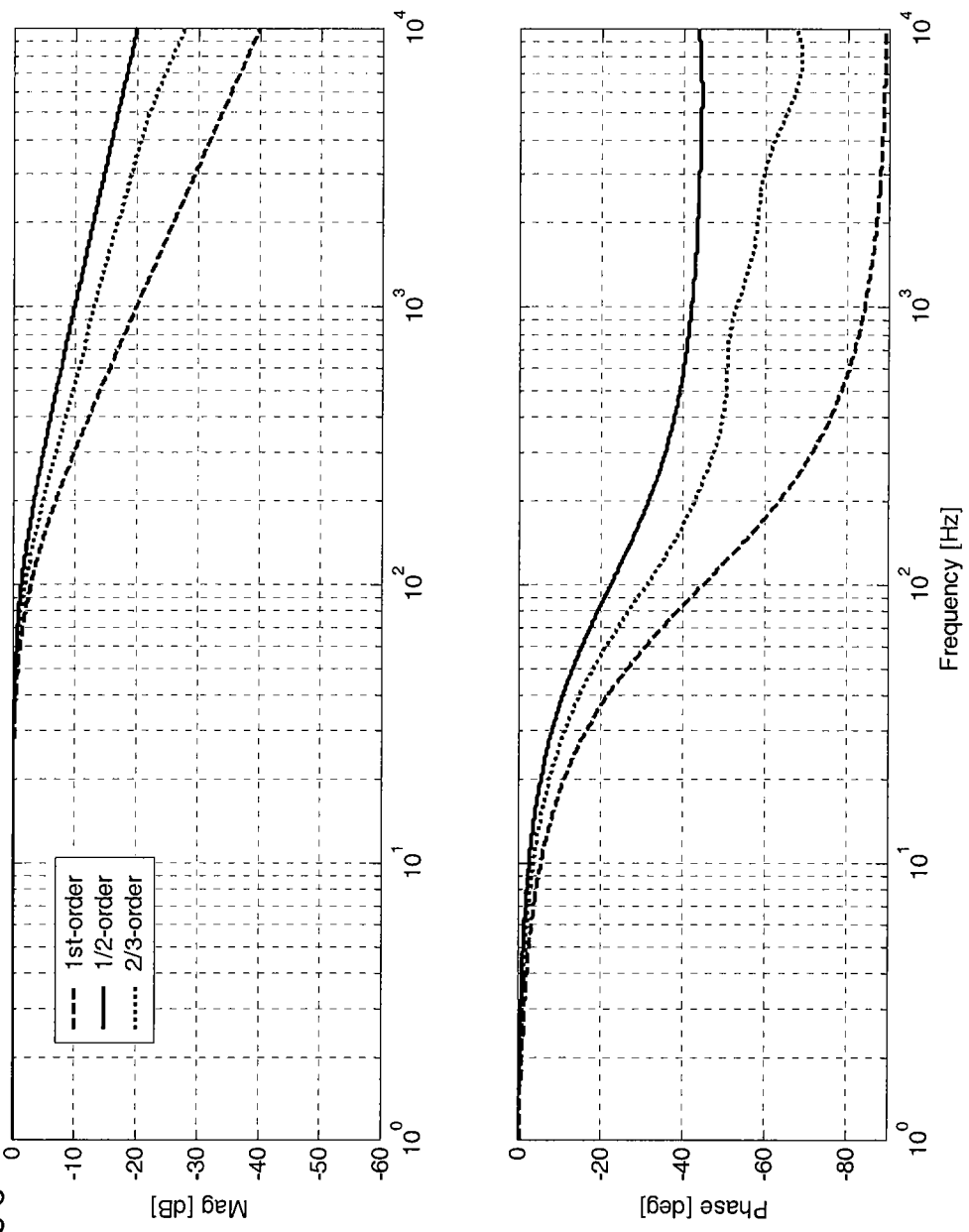
FIG. 6 depicts a Bode plot of low pass filters of first order, half order and ⅔ order.

FIG. 6 shows a comparison between a prior art first-order low-pass filter, and partial order low-pass filter according to the invention, in particular a half-order low-pass filter and a ⅔-order low-pass filter as described above. The ½-order filter and ⅔-order filters use a third-order approximation, resulting in filter orders of 8 and 27, respectively.

It can be seen that the half order filter has a phase shift of approximately −45 degrees, the ⅔ order filter a phase shift of approximately −60 degrees, while the conventional first order filter has a phase shift of −90 degrees. Further, for frequencies above the cut-off frequency the gain has a slope of −20 dB per decade for the first order filter, approximately −10 dB per decade for the half order filter and approximately −15 dB per decade for the ⅔-order filter.

Figure 7:
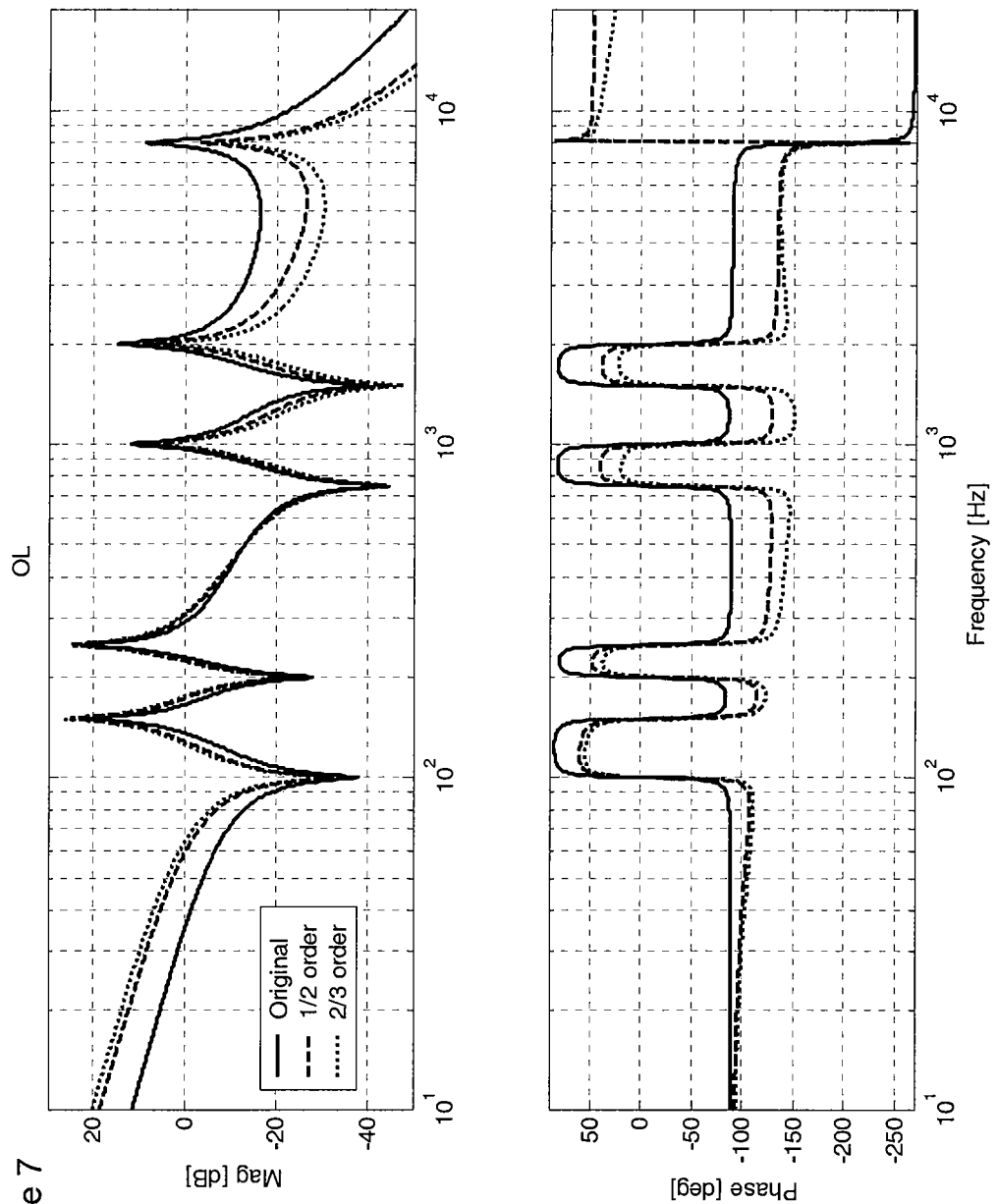
FIG. 7 depicts a Bode plot showing the results of the application of a partial order low-pass filter according to the present invention.

FIG. 7 shows the results of the application of a half order low-pass filter unit and a low pass ⅔ order filter in the system shown in FIG. 2. The Bode plot of FIG. 7 shows the plot of the open loop control system of FIG. 4 without a low-pass filter, with a half order low-pass filter and a ⅔ order low-pass filter. All low-pass filters have a cutoff frequency of 100 Hz. The filters are gain adjusted such that at 500 Hz, the amplitude for all plots is the same. This way, up to at least 500 Hz the damping properties are not deteriorated by application of the partial low-pass filters. There is even some improvement, as the low-frequency amplitude has increased between 100 and 500 Hz. The filter orders of the partial low-pass filters are 8 and 9, respectively, for the ½ and ⅔ order filters. It can be seen that the 8 kHz peak has been reduced enough to ensure a stable system although the phase crosses −180 degrees, since the gain is substantially smaller than 0 dB.

For an active damping system using feedback of measured acceleration to an actuator force, a general problem is the increasing gain for higher frequencies, due to decoupling of mass in the object to be damped. When low-pass filtering using a prior art filter unit is not an option, because even a first order filter already introduces 90 degrees extra phase lag, leading to instability, filtering with a partial-order filter according to the invention may be an attractive alternative. A partial order filter unit allows filtering over a large frequency range, because the phase lag is only a fraction of 90 degrees, e.g. for a half-order filter, the phase shift equals approximately 45 degrees. Implementation of the partial order filters uses for instance a polynomial transfer function or any other suitable transfer function that approximates $\sqrt{s}$ (half-order filter), or $s^{2/3}$ (⅔-order filter).

Hereinabove it has been shown that the application of a partial order filter unit is beneficial when the phase shift of a first order filter unit is too large so that implementation of such first order filter unit would lead to an unstable system. By using a partial filter unit only a part of such −90 degrees phase shift, may be obtained. A partial filter unit may also be applied to increase the bandwidth of a position control system, since the phase shift resulting from the application of filters is no longer restricted by steps of −90 degrees per order of the filter unit.

Hereinabove, partial order low-pass filter units have been described to show the possible advantages of partial order filter units. Partial order filter units and their approximations by rational transfer functions may also be used for any other type of filter units such as band-pass filters, high pass filters, etc, wherein the above described characteristics of the partial order filter units are advantageous.

The position control system/active damping device according to an embodiment of the invention may include, next to the partial order filter unit, one or more filter units of first or higher orders, i.e. second, third, fourth, etc. Such combination may be applied as a series of separate filter units, but also as a combined filter unit for instance a 1½ order filter unit. Such combined filter units are regarded to be a partial order filter unit according to the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A control system comprising:
   a measurement system configured to measure a position or position related quantity of an object;
   a controller configured to provide a control signal based on the measured position or position related quantity;
   an actuator configured to actuate the object based on the control signal; and
   a partial order filter unit configured to filter the measured position or position related quantity.

2. The control system of claim 1, wherein the partial order filter unit is a half order filter unit.

3. The control system of claim 1, wherein the controller comprises an integrator control unit.

4. The control system of claim 1, wherein the partial order filter unit comprises a filter having a rational transfer function representing a partial order.

5. The control system of claim 4, wherein the system is configured to have a fourth order transfer function.

6. The control system of claim 1, wherein the position control system is an active damping system.

7. The control system of claim 1, wherein the actuator is arranged between the object and a proof mass, the proof mass only being connected to the actuator.

8. The control system of claim 1, wherein the filter unit comprises a low-pass filter.

9. The control system of claim 1, wherein the object is a projection system of a lithographic apparatus.

10. A lithographic apparatus comprising:
    a support structure constructed to support a patterning device being capable of imparting the radiation beam with a pattern in its cross-section to form a patterned radiation beam;
    a substrate table constructed to hold a substrate;
    a projection system configured to project the patterned radiation beam onto a target portion of the substrate, and
    a control system to control a position or position related quantity of an object of the lithographic apparatus, wherein the control system comprises a partial order filter unit.

11. The lithographic apparatus of claim 10, wherein the position control system is an active damping system.

12. The lithographic apparatus of claim 11, wherein the object is the projection system.

13. The lithographic apparatus of claim 10, wherein the partial order filter unit is a low-pass filter unit.

14. The lithographic apparatus of claim 10, wherein the partial order filter unit is a half order filter unit.

15. The lithographic apparatus of claim 10, wherein the partial order filter unit comprises a rational transfer function representing a partial order.

16. A control system, comprising:
    a measurement system configured to measure a position or position related quantity of an object;
    a controller configured to provide a control signal based on the measured position or position related quantity;
    an actuator configured to actuate the object based on the control signal, and
    a filter unit configured to filter a signal associated with the measured position or position related quantity, wherein the filter unit is a partial order filter unit.

17. The control system of claim 16, wherein the position related quantity is acceleration of the object.

18. A device manufacturing method comprising:
    patterning a beam of radiation to form a patterned beam of radiation;
    projecting the patterned beam of radiation onto a target portion of a substrate with a projection system; and
    controlling a position or position related quantity of the projection system, the controlling comprising, measuring the position or position related quantity of the projection system,
providing a control signal based on the measured position or position related quantity,
exerting a force on the projection system based on the control signal, and
filtering a signal associated with the measured position or position related quantity, wherein the filter unit is a partial order filter unit.

* * * * *